(12) United States Patent
Chan et al.

(10) Patent No.: US 10,340,851 B2
(45) Date of Patent: Jul. 2, 2019

(54) DIFFERENTIAL CASCODE AMPLIFIER WITH SELECTIVELY COUPLED GATE TERMINALS

(71) Applicant: QUALCOMM Incorporated, San Diego, CA (US)

(72) Inventors: Alan Ngar Loong Chan, San Jose, CA (US); Gareth Seng Thai Yeo, Milpitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 67 days.

(21) Appl. No.: 14/258,669

(22) Filed: Apr. 22, 2014

(65) Prior Publication Data

US 2015/0303876 A1 Oct. 22, 2015

(51) Int. Cl.
| | | |
|---|---|---|
| *H03F 3/45* | (2006.01) | |
| *H03F 1/02* | (2006.01) | |
| *H03F 3/193* | (2006.01) | |
| *H03F 3/21* | (2006.01) | |
| *H03F 3/24* | (2006.01) | |

(Continued)

(52) U.S. Cl.
CPC ......... *H03F 1/0205* (2013.01); *H03F 1/3211* (2013.01); *H03F 1/523* (2013.01); *H03F 3/193* (2013.01); *H03F 3/21* (2013.01); *H03F 3/245* (2013.01); *H03F 3/45188* (2013.01); *H03F 3/72* (2013.01); *H03G 1/0029* (2013.01); *H03G 1/0088* (2013.01); *H03F 2200/129* (2013.01); *H03F 2200/451* (2013.01); *H03F 2200/541* (2013.01); *H03F 2203/45024* (2013.01); *H03F 2203/45116* (2013.01);

(Continued)

(58) Field of Classification Search
CPC .......... H03F 3/193; H03F 1/22; H03F 1/0205; H03F 1/523; H03F 1/3211; H03F 3/45188; H03F 3/245; H03F 3/72; H03F 3/21; H03G 1/0088; H03G 1/0029
USPC ........................................... 330/51, 253, 311
See application file for complete search history.

(56) References Cited

U.S. PATENT DOCUMENTS 6,377,120 B1 * 4/2002 Hsieh .................. H03F 3/45188
327/314
6,791,372 B2 9/2004 Jaussi
(Continued)

FOREIGN PATENT DOCUMENTS

CN 100481713 C 4/2009
CN 102106082 A 6/2011
(Continued)

OTHER PUBLICATIONS

Kim et al "An EDGE/GSM Quad-Based CMOS Power amplifier" IEEE International Solid-State Circuits conference, year 2011.*
(Continued)

*Primary Examiner* — Khanh V Nguyen
*Assistant Examiner* — Khiem D Nguyen
(74) *Attorney, Agent, or Firm* — Qualcomm Incorporated-Toler

(57) ABSTRACT

An apparatus includes a differential cascode amplifier including a first transistor and a second transistor. The apparatus further includes a transistor including a source terminal coupled to a gate terminal of the first transistor of the differential cascode amplifier. The transistor also includes a drain terminal coupled to a gate terminal of the second transistor of the differential amplifier.

20 Claims, 7 Drawing Sheets

(51) Int. Cl.
*H03F 3/72* (2006.01)
*H03G 1/00* (2006.01)
*H03F 1/32* (2006.01)
*H03F 1/52* (2006.01)

(52) U.S. Cl.
CPC .............. *H03F 2203/45302* (2013.01); *H03F 2203/45731* (2013.01); *H03F 2203/7206* (2013.01)

(56) References Cited

U.S. PATENT DOCUMENTS

| | | | |
|---|---|---|---|
| 7,821,339 | B1 | 10/2010 | Afsahi |
| 7,868,691 | B2 * | 1/2011 | Groe ....................... H03F 3/211 330/51 |
| 7,898,328 | B2 * | 3/2011 | Matsui ................... H03F 3/195 330/253 |
| 8,229,367 | B2 | 7/2012 | Chan et al. |
| 8,624,632 | B2 | 1/2014 | Bulzacchelli |
| 8,659,473 | B2 | 2/2014 | Bauwelinck et al. |
| 2006/0097792 | A1 | 5/2006 | Ryu et al. |
| 2009/0289721 | A1 | 11/2009 | Rajendran et al. |
| 2012/0286875 | A1 | 11/2012 | Chan |
| 2014/0225675 | A1 * | 8/2014 | Kaukovuori ............ H03F 3/195 330/307 |

FOREIGN PATENT DOCUMENTS

| | | |
|---|---|---|
| EP | 1657816 A2 | 5/2006 |
| JP | 2010141753 A | 6/2010 |
| JP | 2010147992 A | 7/2010 |

OTHER PUBLICATIONS

International Search Report and Written Opinion for International Application No. PCT/US2015/025770, ISA/EPO, dated Jul. 21, 2015, 13 pages.
Lai, J.W., et al., "A World-Band Triple-Mode 802.11a/b/g Soc in 130-nm CMOS", IEEE Journal of Solid-State Circuits, Nov. 2009, vol. 44, No. 11, IEEE, Piscataway, NJ, pp. 2911-2921.

\* cited by examiner

DIFFERENTIAL CASCODE AMPLIFIER WITH SELECTIVELY COUPLED GATE TERMINALS

I. FIELD

The present disclosure is generally related to differential cascode amplifiers with one or more gain cells in an off-state.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A wireless telephone or other wireless device may include a transmitter that sends signals via an antenna. The signals may be amplified prior to being sent by the antenna, such as at a power amplifier (PA) stage or a driver amplifier (DA) stage of the wireless device. The PA stage (or the DA stage) may be magnetically coupled to the antenna, such as via a transformer, and may have a differential cascode configuration (e.g., may include differential pairs of cascode transistors) that enables the PA stage (or the DA stage) to provide a differential amplified signal to the antenna via the transformer. During operation, the wireless device may selectively activate portions (e.g., "cells") of the PA stage (or DA stage) to adjust a gain of the differential amplified signal. For example, gate terminals of transistors in the cells may be activated when a bias voltage has a logical high voltage level or may be deactivated when the bias voltage has a logical low voltage level (e.g., approximately zero volts).

Adjusting the bias voltage to the logical low voltage level (e.g., approximately zero volts) to deactivate cells may "stress" the transistors. For example, while adjusting the gain of the PA stage (or DA stage), a transistor of a cascode device of a deactivated cell may have a drain voltage that is substantially greater than the bias voltage, causing voltage "stress" to the transistor. This voltage "stress" may damage the transistor (e.g., by damaging a gate oxide region of the transistor), and may decrease reliability of the amplifier stage. While the logical low voltage level bias voltage may be increased to reduce drain-to-gate voltage differences of deactivated transistors, this technique increases leakage current (e.g., signal leakage) through the cascode device and thereby reduces the linearity between an amplified output of the cascode device and an input of the cascode device.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
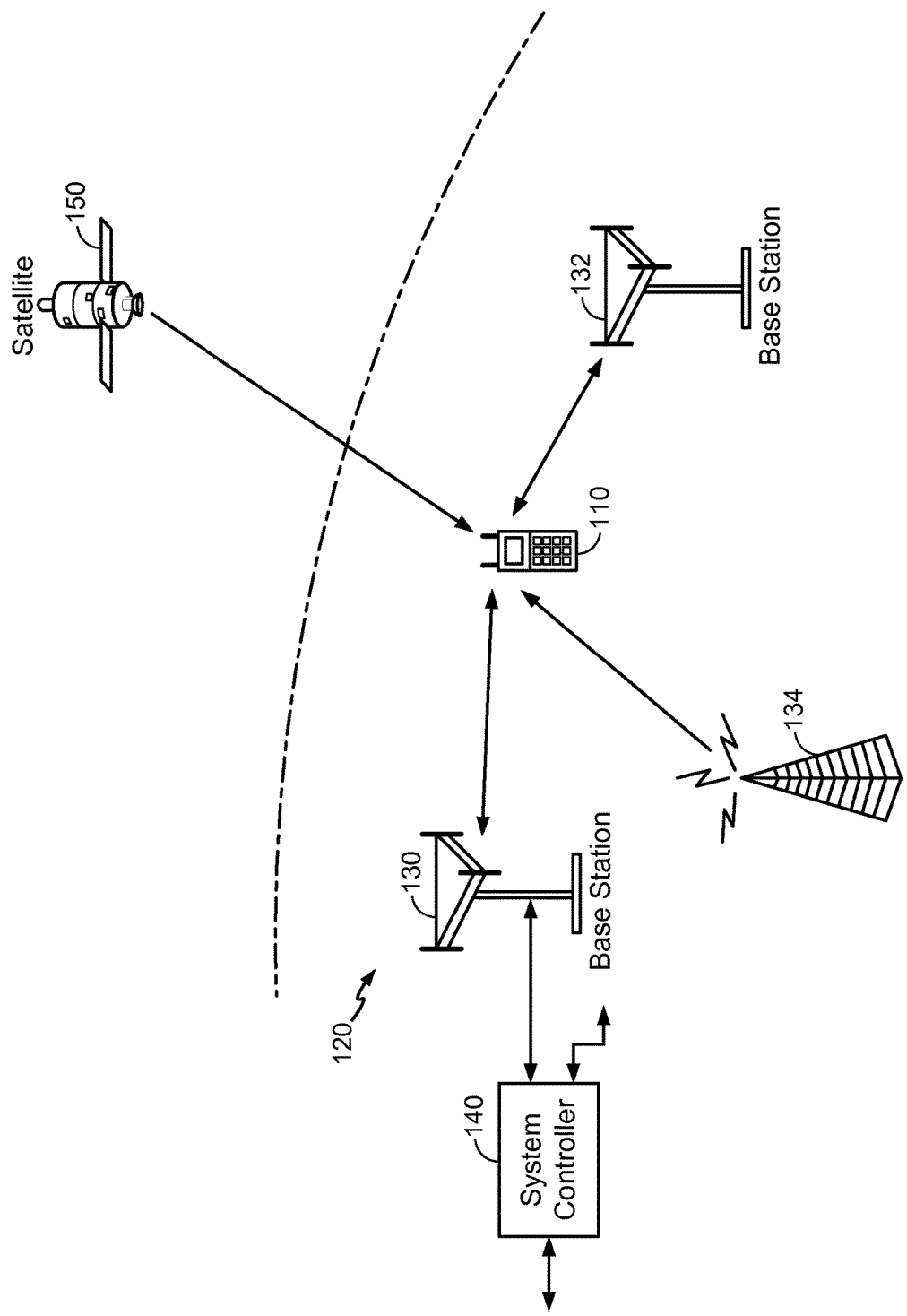
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1× (CDMA2000 1×RTT), Evolution-Data Optimized (EV-DO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with the wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EV-DO, TD-SCDMA, GSM, 802.11, etc.

Figure 2:
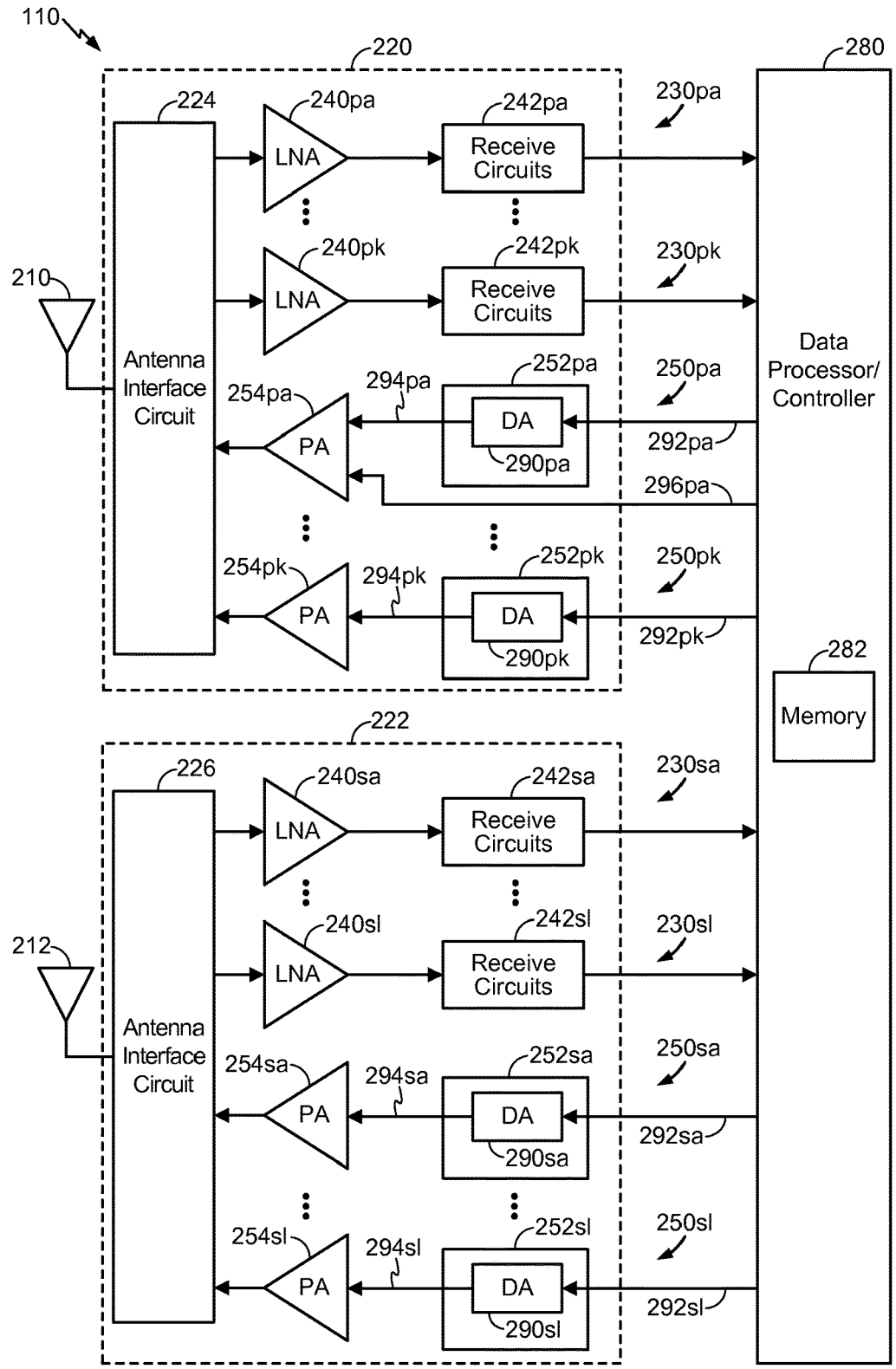
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc. Transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230pa-230pk, 230sa-230sl includes an LNA 240pa-240pk, 240sa-240sl and a receive circuit 242pa-242pk, 242sa-242sl, respectively. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below provides an example in which the receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each remaining receiver in transceivers 220 and 222 may operate in a similar manner as receiver 230pa.

In the exemplary design shown in FIG. 2, each transmitter 250pa-250pk, 250sa-250sl includes a transmit circuit 252pa-252pk, 252sa-252sl and a power amplifier (PA) 254pa-254pk, 254sa-254sl, respectively. For data transmission, data processor/controller 280 processes (e.g., encodes and modulates) data to be transmitted and provides an analog output signal to a selected transmitter. The description below provides an example in which the transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter in transceivers 220 and 222 may operate in a similar manner as transmitter 250pa.

FIG. 2 shows an exemplary design of receivers 230pa-230pk and 230sa-230sl and transmitters 250pa-250pk and 250sa-250sl. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240pa-240pk and 240sa-240sl and receive circuits 242pa-242pk and 242sa-242sl may be implemented on one module, which may be an RFIC, etc. The circuits in transceivers 220 and 222 may also be implemented in other manners.

In an exemplary embodiment, the transmit circuits 252pa-252pk, 252sa-252sl may include driver amplifiers 290pa-290pk, 290sa-290sl, respectively. The driver amplifiers 290pa-290pk, 290sa-290sl may receive first transmission signals 292pa-292pk, 292sa-292sl (e.g., input signals) from the data processor/controller 280. In an exemplary embodiment, the power amplifiers 254pa-254pk, 254sa-254sl may receive second transmission signals 294pa-294pk, 294sa-294sl from the driver amplifiers 290pa-290pk, 290sa-290sl, respectively. In an exemplary embodiment, the first transmission signals 292pa-292pk, 292sa-292sl and/or the second transmission signals 294pa-294pk, 294sa-294sl may include differential signals (e.g., the first differential signal 334 and the second differential signal 336 of FIG. 3 or the first differential signal (PA Input +) 450 and the second differential signal (PA Input −) 452 of FIG. 4).

Figure 3:
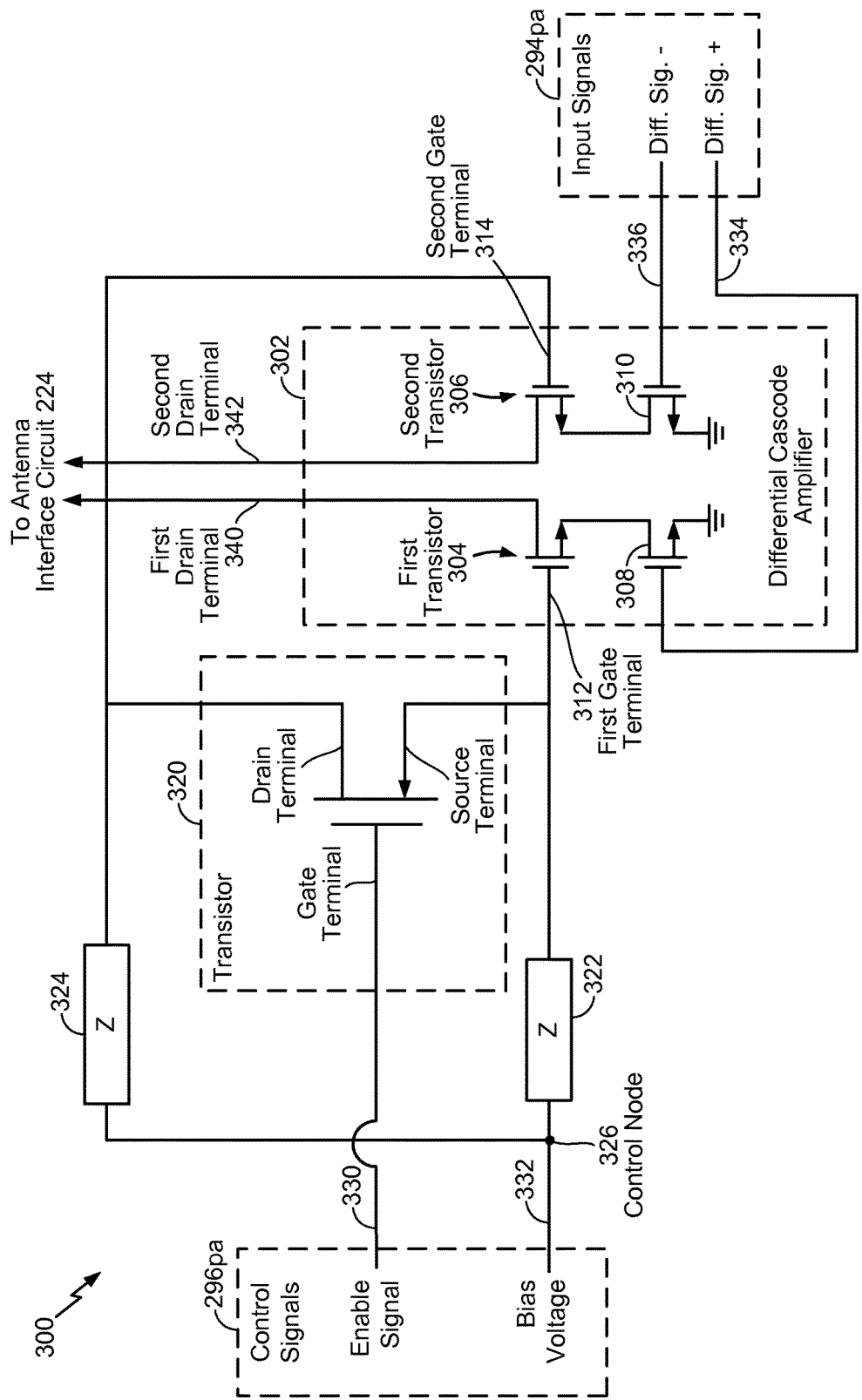
FIG. 3 is a block diagram that depicts an exemplary embodiment of an amplifier within a component of the wireless device of FIG. 2.
Figure 4:
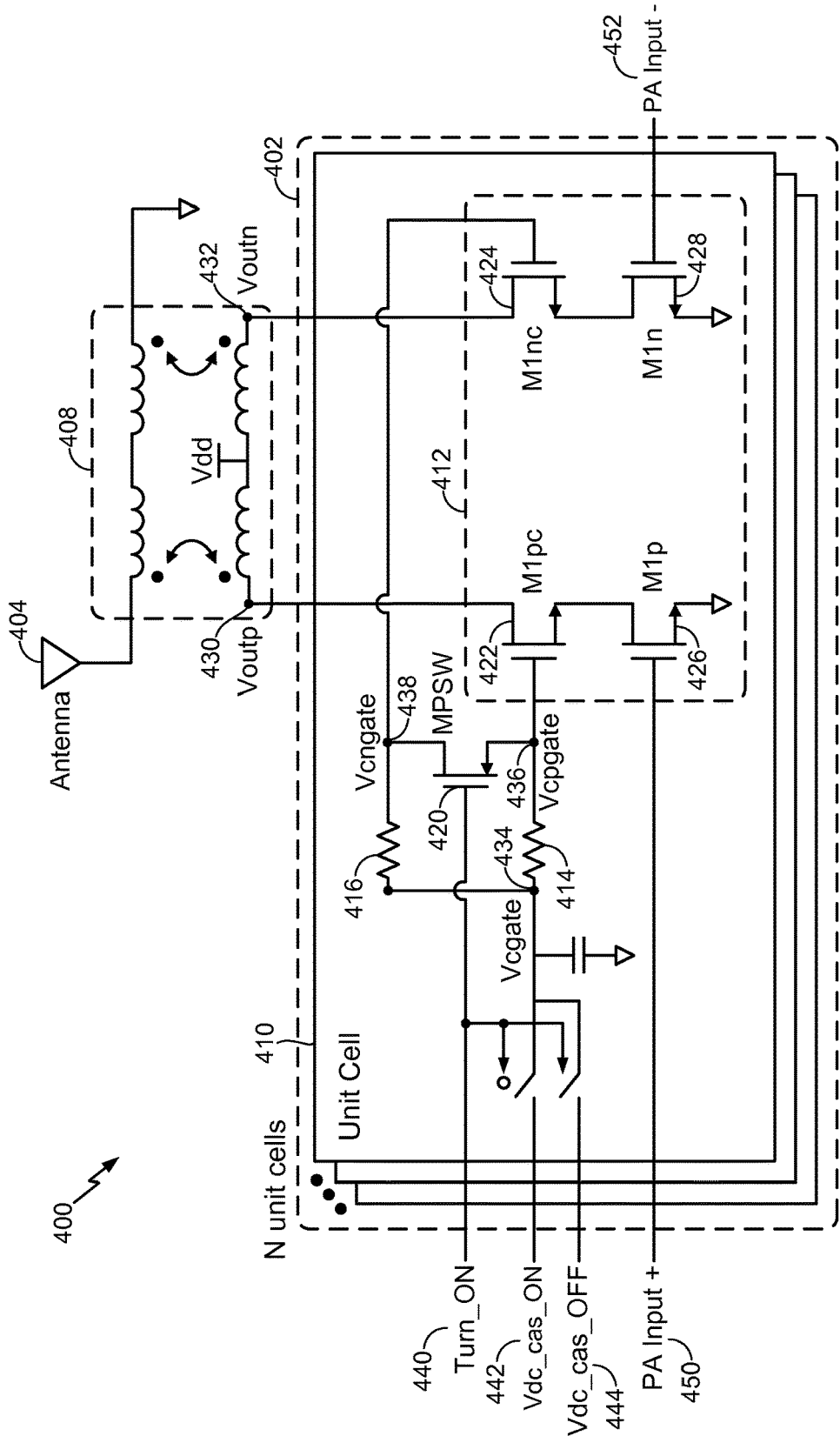
FIG. 4 is a diagram that depicts an exemplary embodiment of a circuit that includes elements incorporated in an amplifier of the wireless device of FIG. 2.
Figure 7:
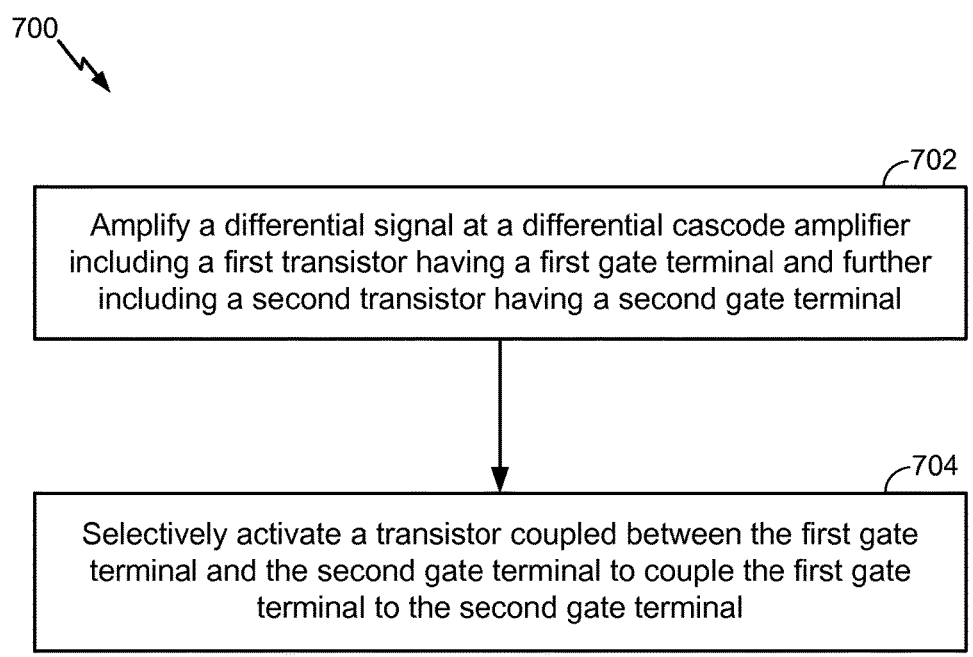
FIG. 7 is a flowchart that illustrates an exemplary embodiment of a method of selectively isolating gate terminals of transistors in a differential cascode amplifier.

One or more of the power amplifiers 254pa-254pk, 254sa-254sl and/or one or more of the driver amplifiers 290pa-290pk, 290sa-290sl may include a differential cascode amplifier (e.g., the differential cascode amplifier 302 of FIG. 3 that includes a first transistor 304 having a first gate terminal 312 and a second transistor 306 having a second gate terminal 314), a transistor (e.g., the transistor 320 of FIG. 3), a first high impedance element (e.g., the first high impedance element 322 of FIG. 3) coupled to the first gate terminal 312 and to a control node (e.g., the control node 326 of FIG. 3), and a second high impedance element (e.g., the second high impedance element 324 of FIG. 3) coupled to the second gate terminal 314 and to the control node, as described in greater detail with respect to FIGS. 3-4 and 7.

For example, one or more of the driver amplifiers 290pa-290pk, 290sa-290sl may include the differential cascode amplifier 302 of FIG. 3 that is operable to receive and amplify a first transmission signal (e.g., one of 292pa-292pk, 292sa-292sl, respectively), from the data processor/controller 280. As another example, one or more of the power amplifiers 254pa-254pk, 254sa-254sl may include the differential cascode amplifier 302 of FIG. 3 that is operable to receive and amplify a second transmission signal (e.g., 294pa-294pk, 294sa-294sl) from the one or more of driver amplifiers 290pa-290pk, 290sa-290sl. Additionally or alternatively, the system 400 of FIG. 4 may be included in or used to implement one or more of the PAs 254p-254pk, 254sa-254sl and/or one or more of the DAs 290pa-290pk, 290sa-290sl.

As described further with reference to FIGS. 3-7, reliability, power consumption, and response linearity of the one or more power amplifiers 254pa-254pk, 254sa-254sl and/or the one or more of the driver amplifiers 290pa-290pk, 290sa-290sl may be improved using the differential cascode amplifier 302 of FIG. 3 in which the transistor 320 is coupled to two gate terminals 312, 314 of two transistors 304, 306, respectively, of the differential cascode amplifier 302.

Data processor/controller 280 may perform various functions for wireless device 110. For example, data processor/controller 280 may perform processing for data being received via receivers 230pa-230pk, 230sa-230sl and data being transmitted via transmitters 250pa-250pk, 250sa-250sl. Data processor/controller 280 may control the operation of the various circuits within transceivers 220 and 222. For example, the data processor/controller 280 may provide control signals 296pa to the PA 254pa. The control signals 296pa may include an enable signal (e.g., the enable signal 330 of FIG. 3 or the enable signal (TURN_ON) 440 of FIG. 4) and a bias voltage (e.g., the bias voltage 332 of FIG. 3 or the first bias signal (Vdc_cas_ON) 442 and the second bias signal (Vdc_cas_OFF) 444 of FIG. 4). The data processor/controller 280 may provide similar control signals to the PAs 254pa-254pk, 254sa-254sl and/or to the DAs 290pa-290pk, 290sa-290sl. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas. The wireless device 110 of FIGS. 1 and 2 illustrates an exemplary device (including a differential cascode amplifier, a transistor, a first high impedance element, and a second high impedance element) that reduces a possibility of damage to one or more transistors of the differential cascode amplifier, as further described with reference to FIGS. 3-4 and 7.

Referring to FIG. 3, an exemplary embodiment of an amplification system 300 is shown. The amplification system 300 may be included in a power amplifier or a driver amplifier. As described herein by way of example, the amplification system 300 may be included in or used to implement the PA 254pa. In other exemplary embodiments, the amplification system 300 may be included in or used to implement one or more of the power amplifiers 254pa-254pk, 254sa-254sl or one or more of the driver amplifiers 290pa-290pk, 290sa-290sl of FIG. 2.

The amplification system 300 may include a differential cascode amplifier 302 that includes a first transistor 304 having a first gate terminal 312 and a second transistor 306 having a second gate terminal 314. The differential cascode amplifier 302 may also include a third transistor 308 coupled to the first transistor 304 and a fourth transistor 310 coupled to the second transistor 306. The first transistor 304 and the third transistor 308 may form a first cascode transistor pair and the second transistor 306 and the fourth transistor 310 may form a second cascode transistor pair. The third transistor 308 may be configured to receive a first differential signal 334 and the fourth transistor 310 may be configured to receive a second differential signal 336. In an exemplary embodiment, the differential signals 334, 336 may correspond to the second transmission signals 294pa received from the DA 290pa of FIG. 2. In other exemplary embodiments, the differential signals may correspond to one or more of the first transmission signals 292pa-292pk, 292sa-292sl and/or one or more of the second transmission signals 294pa-294pk, 294sa-294sl of FIG. 2.

The amplification system 300 may also include a transistor 320 (e.g., a main transistor) coupled to the first gate terminal 312 and to the second gate terminal 314. In an exemplary embodiment illustrated in FIG. 3, the transistor 320 may be a p-type metal oxide semiconductor (PMOS) transistor. Alternatively, the transistor 320 may be an n-type metal oxide semiconductor (NMOS) transistor in other exemplary embodiments. The transistor 320 may operate as a switch. A gate terminal of the transistor 320 may be responsive to an enable signal 330 to selectively couple the first gate terminal 312 to the second gate terminal 314. For example, a drain terminal of the transistor 320 may be coupled to the second gate terminal 314, and a source terminal of the transistor 320 may be coupled to the first gate terminal 312. In an exemplary embodiment, the enable signal 330 and a bias voltage 332 may be received from the data processor/controller 280 as control signals 296pa in FIG. 2. When the transistor 320 conducts (e.g., when current propagates between the source terminal and the drain terminal), the first gate terminal 312 is coupled to the second gate terminal 314 via the transistor 320.

Additionally, the amplification system 300 may include a first high impedance element (Z) 322 coupled to the first gate terminal 312 and to a control node 326 and a second high impedance element (Z) 324 coupled to the second gate terminal 314 and to the control node 326. The high impedance elements 322 and 324 may provide a high impedance between the control node 326 and the gate terminals 312, 314, respectively. Each of the high impedance elements 322 and 324 may have a high impedance value, and the transistor 320 and the high impedance elements 322 and 324 may enable each of the first gate terminal 312 and the second gate terminal 314 to be biased based on the bias voltage 332 provided to the control node 326. In a first exemplary embodiment, the first high impedance element 322 and the second high impedance element 324 may be resistors. For example, the high impedance elements 322 and 324 may each have a resistance of at least 10 kilo-ohms. In a second exemplary embodiment, the first high impedance element 322 and the second high impedance element 324 may be inductors. For example, the high impedance elements 322 and 324 may be inductors that provide a frequency dependent high impedance value.

During operation, the amplification system 300 receives the differential signals 334 and 336 from the DA 290pa. During a first mode of operation (e.g., an enabled or active mode) of the differential cascode amplifier 302, the enable signal 330 is asserted and the transistor 320 is activated to couple the first gate terminal 312 to the second gate terminal 314. The first gate terminal 312 and the second gate terminal 314 may be biased by the bias voltage 332, which is at a particular voltage level (e.g., one volt) sufficient to enable (e.g., turn on) the transistors 304, 306 during the first mode of operation, to cause the differential cascode amplifier 302 to amplify the received differential signals 334, 336 and to provide the amplified differential output signals 340, 342 to the antenna interface circuit 224 of FIG. 2.

During a second mode of operation (e.g., a disabled or inactive mode), the enable signal 330 is de-asserted, the transistor 320 is deactivated, and the bias voltage 332 is set at a logical low voltage level (e.g., zero volts). Deactivating the transistor 320 increases an impedance (e.g., facilitates an impedance increase) from the first gate terminal 312 to the second gate terminal 314. The impedance increase may be based at least in part on the first high impedance element 322 and the second high impedance element 324. Increasing the impedance may isolate, or substantially isolate, the first gate terminal 312 from the second gate terminal 314, enabling gate voltages at the gate terminals 312, 314 to independently "float." Because the gate voltages "float," each gate voltage may be responsive to a respective drain voltage due to parasitic drain-to-gate capacitances of the transistors 304, 306. For example, a first gate voltage at the first gate terminal 312 may "track" (e.g., may change voltage in response to) a first drain voltage at a first drain terminal of the first transistor 304. Similarly, a second gate voltage at the second gate terminal 314 may "track" a second drain voltage at a second drain terminal of the second transistor 306. Thus, drain-to-gate voltages of the transistors 304, 306 may be reduced during the second operating mode because the gate voltages at the gate terminals 312, 314 change voltage in response to the respective drain voltages, as compared to other differential cascode amplifiers in which the gate voltages do not change (e.g., fixed at a logical low voltage value) during the second operating mode.

Reducing drain-to-gate voltages may reduce voltage "stress" on transistors in amplifiers that include multiple unit cells (e.g., gain cells) in an off-state, such as the system 400 which is described in greater detail with reference to FIG. 4. In certain amplifiers that include multiple unit cells and that do not include the transistor 320 and the high impedance elements 322, 324, voltages at drain terminals may reach sufficiently high levels to cause voltage "stress" on the transistors. For example, in other differential cascode amplifiers that do not include the transistor 320 and the high impedance elements 322 and 324, the gate voltages are "forced" to the logical low voltage level (e.g., zero volts) when the differential cascode amplifiers are disabled. However, the drain terminals of the transistors in such other differential cascode amplifiers may be coupled to other drain terminals of other transistors in other unit cells of the same transceiver. Multiple other unit cells may be active, causing voltages at the drain terminals of the transistors of the other differential cascode amplifiers to reach high voltage levels while the respective gate voltages are "forced" to the logical low voltage level. Accordingly, the transistors of the other differential cascode amplifiers experience high drain-to-gate voltages when the other differential cascode amplifiers are disabled. High drain-to-gate voltages may cause voltage "stress" to the transistors, which may cause damage to the transistors and reduce reliability of the other differential cascode amplifiers.

In contrast, the transistor 320 enables the amplification system 300 to prevent or reduce damage to the transistors 304 and 306. For example, when the transistor 320 is deactivated, the gate voltages of the gate terminals 312 and 314 "track" the respective drain voltages, instead of being forced to a logical low voltage level. Thus, drain-to-gate voltages of the transistors 304 and 306 reduce voltage "stress" on the transistors 304 and 306. Reducing the voltage "stress" may prevent or reduce damage to the transistors 304 and 306 when the differential cascode amplifier 302 is disabled.

Additionally, the transistor 320 may increase linearity of the differential cascode amplifier 302 (e.g., linearity between the amplified differential output signals 340, 342 and the received differential signals 334, 336). As used herein, a differential cascode amplifier configured in a "switched" configuration refers to a differential cascode amplifier with gate terminals of transistors coupled to the transistor 320 and the high impedance elements 322, 324, as illustrated in FIG. 3. In contrast, a differential cascode amplifier configured in a "gate-coupled" configuration refers to a differential cascode amplifier where gate terminals of the transistors are directly coupled together (e.g., a differential cascode amplifier that does not include the transistor 320 and the high impedance elements 322, 324). By enabling the gate voltages at the gate terminals 312, 314 to "track" the respective drain voltages, the differential cascode amplifier 302 in the "switched" configuration improves linearity between the amplified differential output signals 340, 342 and the received differential signals 334, 336, as compared to a differential cascode amplifier in the "gate-coupled" configuration. For example, in the "gate-coupled" configuration, drain voltages of the transistors may fall below the respective gate voltages, thereby turning on the transistors during the second mode of operation (e.g., the inactive mode). Turning on the transistors during the inactive mode increases leakage current and reduces linearity of the differential cascode amplifier in the "gate-coupled" configuration.

In the "switched" configuration, the gate voltages of the gate terminals 312, 314 change in response to the drain voltages of the transistors 304, 306, such that the drain voltages do not fall below the respective gate voltages. Thus, the transistors 304, 306 are not enabled (e.g., not turned on) during the inactive mode and linearity of the differential output signals 340, 342 is increased as compared to a differential cascode amplifier in the "gate-coupled" configuration. Additional details related to improved linearity are described with reference to FIGS. 4-6.

Referring to FIG. 4, an exemplary embodiment of a system 400 that provides differential amplification with reduced voltage "stress" on transistors is shown. In an exemplary embodiment, the system 400 may be included in a power amplifier or a driver amplifier. For example, as described herein, the system 400 may be included in or used to implement the power amplifier 254$pa$ of FIG. 2. In other exemplary embodiments, the system 400 may be included in or used to implement one or more of the power amplifiers 254$pa$-254$pk$, 254$sa$-254$sl$ and/or one or more of the driver amplifiers 290$pa$-290$pk$, 290$sa$-290$sl$ of FIG. 2.

The system 400 may include an amplifier stage 402 and an antenna 404. The amplifier stage 402 may include a plurality of N "unit cells" (e.g., portions) each forming a power amplifier, where N is a positive integer. For example, the antenna 404 may correspond to the antenna 210, and each unit cell may be included in or used to implement one or more of the PAs, 254$pa$-254$pk$, 254$sa$-254$sl$ of FIG. 2. The amplifier stage 402 and the antenna 404 may be magnetically coupled via an output load, such as via a transformer 408. For example, the transformer 408 may correspond to the antenna interface circuit 224 of FIG. 2. Components of the system 400 may correspond to or may be integrated within a transmitter (e.g., the transmitter 250$pa$ of FIG. 2).

The amplifier stage 402 (e.g., the plurality of unit cells) may include an exemplary unit cell 410 having a differential cascode amplifier 412 and further having a transistor (MPSW) 420 (e.g., a main transistor). The differential cascode amplifier 412 may include a first transistor (M1$pc$) 422, a second transistor (M1$nc$) 424, a third transistor (Mlp) 426 coupled to the first transistor (M1$pc$) 422, and a fourth transistor (Mln) 428 coupled to the second transistor (M1$nc$) 424. The first transistor (M1$pc$) 422 and the third transistor (Mlp) 426 may form a first cascode transistor pair, and the second transistor (M1$nc$) 424 and the fourth transistor (Mln) 428 may form a second cascode transistor pair.

The transistor (MPSW) 420 may be coupled to a first gate terminal 436 of the first transistor (M1$pc$) 422 and to a second gate terminal 438 of the second transistor (M1$nc$) 424. In an exemplary embodiment, the transistor (MPSW) 420 may be a PMOS transistor and may operate as a switch. The transistor (MPSW) 420 may include an input terminal that is responsive to an enable signal (Turn_ON) 440. In an exemplary embodiment, the enable signal (Turn_ON) 440, a first bias voltage (Vdc_cas_ON) 442, and a second bias voltage (Vdc_cas_OFF) 444 may be received from the controller 280 as control signals 296$pa$ of FIG. 2. The unit cell 410 may further include a first resistor 414 (e.g., a first high impedance element) that is coupled to a control node 434 and to the first gate terminal 436 that is further coupled to a first terminal of the transistor (MPSW) 420. The unit cell 410 may further include a second resistor 416 (e.g., a second high impedance element) that is coupled to the control node 434 and to the second gate terminal 438 and that is further coupled to a second terminal of the transistor (MPSW) 420. Each of the resistors 414 and 416 may have a resistance of at least 10 kilo-ohms.

The differential cascode amplifier 412 may be coupled to the transformer 408. For example, a first drain terminal of the first transistor (M1pc) 422 may be coupled to the transformer 408 via a first node 430 and a second drain terminal of the second transistor (M1nc) 424 may be coupled to the transformer 408 via a second node 432. Other unit cells of the plurality of unit cells may be coupled to the first node 430 and to the second node 432 in a similar manner (e.g., each of the nodes 430 and 432 may be coupled to each of the plurality of unit cells). The transformer 408 may be configured to provide an amplified differential output (e.g., Voutp and Voutn) of the N unit cells to the antenna 404. For example, the amplified differential output received at the nodes 430 and 432 may be based on outputs of differential cascode amplifiers in each active unit cell and may be provided to the antenna 404 via the above-described magnetic coupling between the transformer 408 and the antenna 404. Thus, each unit cell of the amplifier stage 402, when activated, contributes to the amplified differential output (Voutp and Voutn).

Each unit cell of the amplifier stage 402 may have a similar configuration as the exemplary unit cell 410. For example, each unit cell may include a corresponding differential cascode amplifier, a corresponding transistor (e.g., a transistor corresponding to the transistor (MPSW) 420), and corresponding resistors (e.g., high impedance elements), and each unit cell may be coupled to the transformer 408 via the nodes 430 and 432. Each unit cell may be selectively activated based on a corresponding enable signal. For example, a subset of unit cells may be deactivated by deactivating a corresponding subset of switches (e.g., via asserting a corresponding subset of enable signals). By selective activation of the N unit cells, a gain of the amplifier stage 402 may be adjusted.

During operation, the amplifier stage 402 may be responsive to differential signals (PA input + 450 and PA input − 452). In an exemplary embodiment, the differential signals (PA input +) 450 and (PA input −) 452 may be received from the DA 290pa as second transmission signals 294pa. The third transistor (M1P) 426 and the fourth transistor (M1n) 428 of the differential cascode amplifier 412 may be responsive to the differential signals (PA input +) 450 and (PA input −) 452. The differential cascode amplifier 412 may operate in different modes of operation based on the enable signal (Turn_ON) 440. The enable signal (Turn_ON) 440 and a pair of switches may be used to bias the control node 434. For example, when the enable signal (Turn_ON) 440 is asserted, the control node 434 may be biased by the first bias signal (Vdc_cas_ON) 442, and when the enable signal (Turn_ON) 440 is de-asserted, the control node 434 may be biased by the second bias signal (Vdc_cas_OFF) 444. In an exemplary embodiment, the first bias signal (Vdc_cas_ON) 442 may provide a substantially constant voltage at a particular voltage level (e.g., approximately one volt or any voltage sufficient to enable the transistors 422, 424) and the second bias signal (Vdc_cas_OFF) 444 may provide a substantially constant voltage at a logical low voltage level (e.g., approximately zero volts).

During a first mode of operation of the differential cascode amplifier 412 (e.g., an "on" mode or activated mode), the first transistor (M1pc) 422 and the second transistor (M1nc) 424 may be activated, based on the first bias signal (Vdc_cas_ON) 442, to contribute to the amplified differential output (e.g., Voutp and Voutn) provided to the antenna 404 via the transformer 408. During the first mode, the transistor (MPSW) 420 may be activated based on a first value (e.g., a logical low voltage level) of the enable signal (Turn_ON) 440 to couple the first gate terminal 436 to the second gate terminal 438. The first gate terminal 436 and the second gate terminal 438 may be biased via the resistors 414 and 416 based on the first bias signal (Vdc_cas_ON) 442.

During the second mode of operation of the differential cascode amplifier 412 (e.g., an "off" mode or deactivated mode), the enable signal (Turn_ON) 440 may be asserted to a second value (e.g., the particular voltage level). De-asserting the enable signal (Turn_ON) 440 deactivates the transistor (MPSW) 420 to increase an impedance from the first gate terminal 436 to the second gate terminal 438 via the resistors 414 and 416. Increasing the impedance from the first gate terminal 436 to the second gate terminal 438 may isolate, or substantially isolate, the first gate terminal 436 from the second gate terminal 438. For example, an impedance of the deactivated transistor (MPSW) 420 may be sufficiently high such that, in combination with the resistors 414 and 416, a first gate voltage (Vcpgate) at the first gate terminal 436 may be substantially independent from a second gate voltage (Vcngate) at the second gate terminal 438.

Isolating, or substantially isolating, the gate terminals 436 and 438 may enable the first gate voltage (Vcpgate) and the second gate voltage (Vcngate) to be responsive to (e.g., to "track") drain voltages of the first transistor (M1pc) 422 and the second transistor (M1nc) 424, respectively. For example, because the first gate terminal 436 is isolated, or substantially isolated, with respect to the second gate terminal 438 when the transistor (MPSW) 420 is deactivated, the first gate voltage (Vcpgate) may "float" to a first voltage based on a first drain voltage (Voutp) of the first transistor (M1pc) 422. The first gate voltage (Vcpgate) may "float" due to a capacitive coupling between the first gate terminal 436 and a first drain terminal of the first transistor (M1pc) 422. In this example, the first gate voltage (Vcpgate) may have a voltage change (e.g., a "swing") that is proportional to a voltage change (e.g., a "swing") of the first drain voltage (Voutp), while remaining at a sufficiently low voltage level such that the first transistor (M1pc) 422 does not turn on. The second gate voltage (Vcngate) may similarly "float" to a second voltage based on a second drain voltage (Voutn) of the second transistor (M1nc) 424 (e.g., due to a capacitive coupling between the second gate terminal 438 and a second drain terminal of the second transistor (M1nc) 424).

Accordingly, a first drain-to-gate voltage difference associated with the first transistor (M1pc) 422 and a second drain-to-gate voltage difference associated with the second transistor (M1nc) 424 may be reduced as compared to a device (e.g., other differential cascode amplifiers) in which gate terminals of amplifier transistors are "forced" via a bias signal to a common logical low voltage level. As explained above with reference to FIG. 3, high drain-to-gate voltages cause voltage "stress" on transistors that may cause damage to the transistors and may decrease reliability of an amplifier. Reducing drain-to-gate voltages reduces a possibility of damage to the transistors 422 and 424, which increases the reliability of the differential cascode amplifier 412.

In a device where the gate terminals of transistors of a differential cascode amplifier are directly coupled together in a "gate-coupled" configuration (e.g., a device without the transistor (MPSW) 420 and resistors 414 and 416), the gate terminals are biased at a logical low voltage level (e.g., zero volts) when the differential cascode amplifier is deactivated. However, drain voltages of the transistors may reach values of 2*Vdd (e.g., a rail voltage), based at least in part on other activated unit cells of the device. Accordingly, drain-to-gate voltages of the transistors may be as large as 2*Vdd when one unit cell is deactivated. Such a large drain-to-gate voltage causes "stress" to the transistors and increases a possibility of damage to the transistors (e.g., damage gate oxide regions of the transistors) of a differential cascode amplifier configured in the "gate-coupled" configuration.

In the system 400 (e.g., a system configured in the "switched" configuration), by using the transistor (MPSW) 420 and the resistors 414 and 416 to isolate, or substantially isolate, the first gate terminal 436 from the second gate terminal 438 during the second mode of operation, voltage "stress" on the transistors 422 and 424 is reduced as compared to "forcing" the first gate voltage (Vcpgate) and the second gate voltage (Vcngate) to a logical low voltage level (e.g., approximately zero volts). For example, the first gate voltage (Vcpgate) may "track" the first drain voltage, thus reducing a drain-to gate voltage and a possibility of damage to the first transistor (M1pc) 422.

Additionally, using the transistor (MPSW) 420 to cause the first gate voltage (Vcpgate) and the second gate voltage (Vcngate) to be responsive to the respective drain voltages may increase linearity of the differential cascode amplifier 412 (e.g., linearity of a relationship between the amplified differential output (e.g., Voutp and Voutn) and the differential signals (PA input +) 450 and (PA input −) 452), as compared to a differential cascode amplifier configured in the "gate-coupled" configuration. For example, causing the first gate voltage (Vcpgate) and the second gate voltage (Vcngate) to be responsive to the respective drain voltages prevents, or reduces a possibility of, the gate voltages from exceeding the respective drain voltages. Accordingly, leakage current may be avoided, or reduced, at the first transistor (M1pc) 422 and the second transistor (M1nc) 424 because the transistors remain off during the second operating mode (e.g., the deactivated mode). In contrast, in a differential cascode amplifier configured in the "gate-coupled" configuration, transistors may turn on, or partially turn on, during the second operating mode, thereby reducing (e.g., degrading) linearity of the corresponding differential cascode amplifier.

Figure 5:
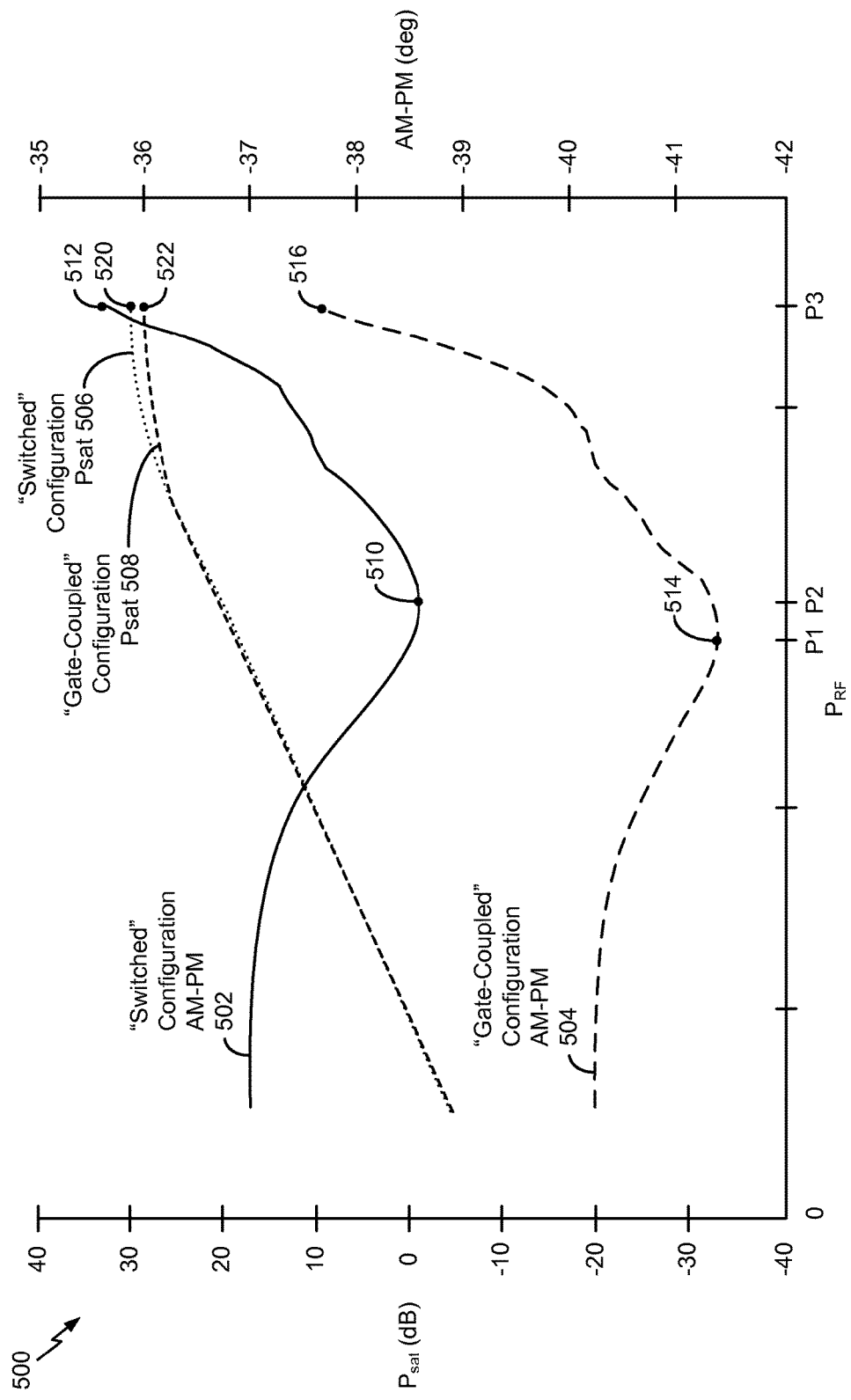
FIG. 5 is a graph of power output at saturation (Psat) and phase-modulation per amplitude-modulation (AM-PM) of a differential cascode amplifier configured in a "switched" configuration.

The system 400, including the differential cascode amplifier 412 configured in the "switched" configuration (e.g., including the transistor (MPSW) 420 and the resistors 414, 416), may provide additional performance benefits as compared to a differential cascode amplifier configured in the "gate-coupled" configuration. Referring to FIG. 5, a graph of power output at saturation (Psat) and phase-modulation per amplitude-modulation (AM-PM) of a differential cascode amplifier configured in the "switched" configuration (referred to herein as a "switched configuration DCA") and a differential cascode amplifier configured in the "gate-coupled" configuration (referred to herein as a "gate-coupled configuration DCA") is illustrated and generally designated 500. In an exemplary embodiment, the switched configuration DCA may correspond to the differential cascode amplifier 302 of the amplification system 300 of FIG. 3 or the differential cascode amplifier 412 of the system 400 of FIG. 4. The graph 500 represents exemplary, non-limiting values. In other embodiments, other values of Psat and AM-PM may be achieved.

The graph 500 includes a first AM-PM curve 502 associated with the switched configuration DCA and a second AM-PM curve 504 associated with the gate-coupled configuration DCA. The AM-PM curves 502, 504 illustrate a relationship between AM-PM and Radio Frequency Power (Prf) for the two differential cascode amplifiers. As illustrated in FIG. 5, AM-PM variation associated with the switched configuration DCA is reduced (e.g., smaller) as compared to AM-PM variation associated with the gate-coupled configuration DCA. For example, the AM-PM values for the "switched" configuration may vary within three degrees for Prf values between zero and P3, as illustrated by an AM-PM difference between a first AM-PM value 510 at P2 and a second AM-PM value 512 at P3. The AM-PM values for the "gate coupled" configuration may vary within four degrees for Prf values between zero and P3, as illustrated by an AM-PM difference between a third AM-PM value 514 at P1 and a fourth AM-PM value 516 at P3. Thus, the "switched" configuration is associated with a reduction in AM-PM variation by at least one degree for Prf values between zero and P3 as compared to the "gate-coupled" configuration.

The graph 500 also includes a first Psat curve 506 associated with the switched configuration DCA and a second Psat curve 508 associated with the gate-coupled configuration DCA. The Psat curves 506, 508 illustrate a relationship between Psat and Prf for the two differential cascode amplifiers. As illustrated in FIG. 5, the Psat of the switched configuration DCA is increased as compared to the Psat of the gate-coupled configuration DCA. For example, at the first Prf value P1, a first Psat value 520 associated with the switched configuration DCA is approximately 29.4 decibels (dB), and a second Psat value 522 associated with the gate-coupled configuration DCA is approximately 28.9 dB. Accordingly, the "switched" configuration is associated with an increase in the Psat (e.g., an increase of approximately 0.5 dB) as compared to the "gate-coupled" configuration.

Figure 6:
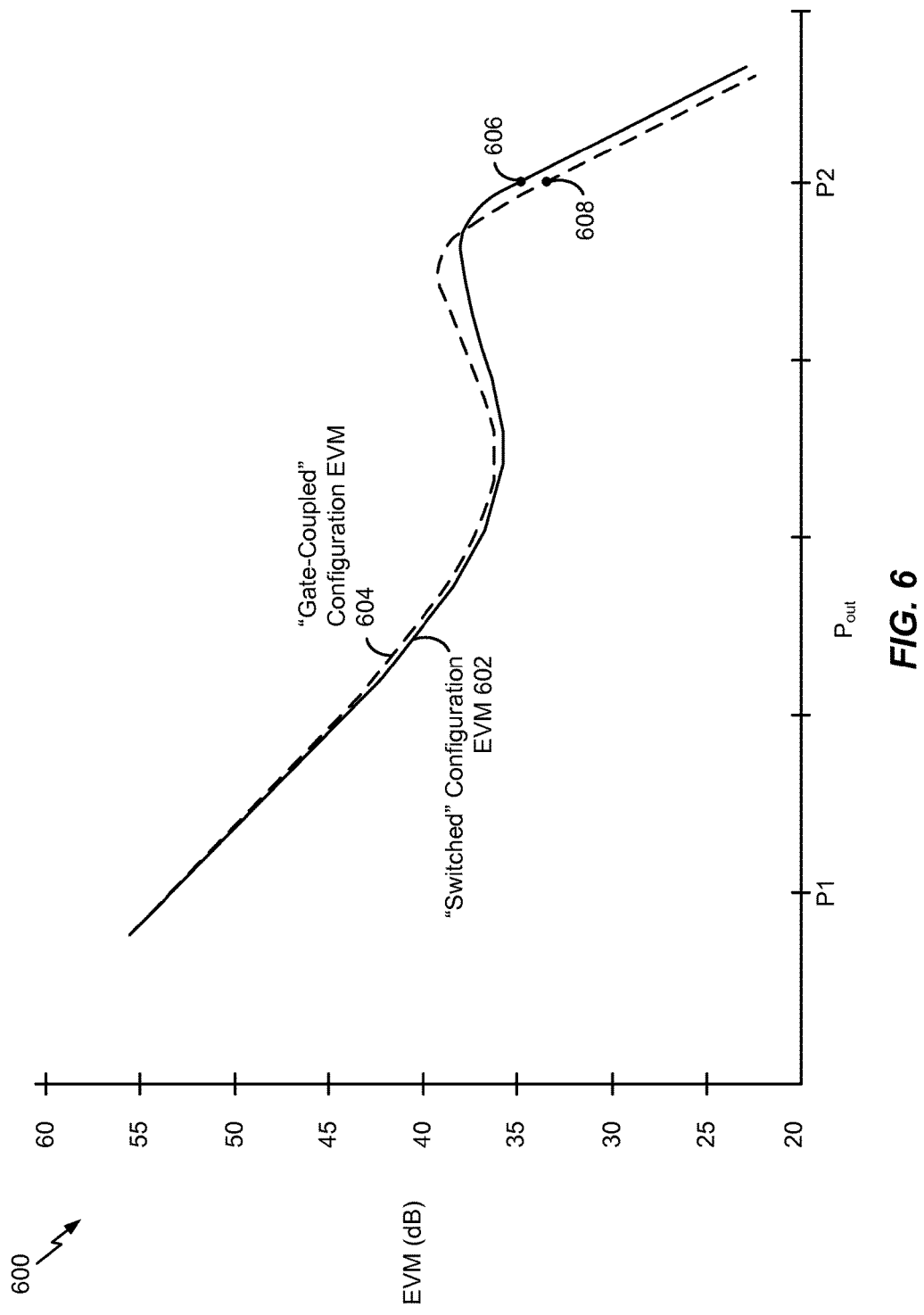
FIG. 6 is a graph of error vector magnitude (EVM) of a differential cascode amplifier configured in a "switched" configuration and EVM of a differential cascode amplifier configured in a "gate-coupled" configuration.

Additional performance improvements are illustrated in FIG. 6, in which a graph of error vector magnitude (EVM) of the switched configuration DCA and the gate-coupled configuration DCA is illustrated and generally designated 600. The graph 600 represents exemplary, non-limiting values. In other embodiments, other values of EVM may be achieved. The graph 600 includes a first EVM curve 602 associated with the switched configuration DCA and a second EVM curve 604 associated with the gate-coupled configuration DCA. The EVM curves 602, 604 illustrate a relationship between EVM and output power (Pout) for the two differential cascode amplifiers. As illustrated in FIG. 6, the EVM of the switched configuration DCA is substantially similar to the EVM of the gate-coupled configuration DCA at low values of Pout and is increased at high values of Pout. For example, at a first Pout value P1, the EVM associated with the switched configuration DCA is substantially similar to the EVM associated with the gate-coupled configuration DCA. At a second Pout value P2 that is greater (e.g., higher) than P1, a first EVM value 606 associated with the switched configuration DCA is approximately 34.9 dB and a second EVM value 608 associated with the gate-coupled configuration DCA is approximately 33.3 dB. Accordingly, the "switched" configuration is associated with an increase in the EVM (e.g., an increase exceeding 1.5 dB) at a Pout value of P2 or greater, as compared to the "gate-coupled" configuration.

Referring to FIG. 7, a flowchart that illustrates an exemplary embodiment of a method of selectively isolating gate terminals of transistors in a differential cascode amplifier is shown and generally designated 700. In an illustrative embodiment, the method 700 may be performed at the wireless device 110 of FIGS. 1-2, the amplification system 300 of FIG. 3, the system 400 of FIG. 4, or a combination thereof.

The method 700 may include amplifying a differential signal at a differential cascode amplifier including a first transistor having a first gate terminal and further including a second transistor having a second gate terminal, at 702. The differential cascode amplifier may include or correspond to the differential cascode amplifier 302 of FIG. 3 or the differential cascode amplifier 412 of FIG. 4. The first transistor may include or correspond to the first transistor 304 of FIG. 3 or the first transistor (M1pc) 422 of FIG. 4. The second transistor may include or correspond to the second transistor 306 of FIG. 3 or the second transistor (M1nc) 424 of FIG. 4.

The method 700 may also include selectively activating a transistor coupled between the first gate terminal and the second gate terminal to couple the first gate terminal to the second gate terminal. For example, the transistor may include or correspond to the transistor 320 of FIG. 3 or the transistor (MPSW) 420 of FIG. 4 and may be responsive to an enable signal (e.g., the enable signal 330 of FIG. 3 or the enable signal (Turn_ON) 440 of FIG. 4), respectively.

In an exemplary embodiment, the method 700 includes deactivating the transistor to increase an impedance from the first gate terminal to the second gate terminal based at least in part on a first high impedance element and a second high impedance element. The first high impedance element may be coupled to the first gate terminal and a control node, and the second high impedance element may be coupled to the second gate terminal and the control node. For example, the transistor 320 may be deactivated to increase the impedance from the first gate terminal 312 to the second gate terminal 314 based at least in part on the first high impedance element 322 and the second high impedance element 324. As another example, the transistor (MPSW) 420 may be deactivated to increase the impedance from the first gate terminal 436 to the second gate terminal 438 based at least in part on the first resistor 414 and the second resistor 416. Deactivating the transistor may cause a first voltage at the first gate terminal to be responsive to (e.g., to "track") a first drain voltage at a first drain terminal of the first transistor and may cause a second voltage at the second gate terminal to be responsive to (e.g., to "track") a second drain voltage at a second drain terminal of the second transistor. For example, deactivating the transistor 320 may cause a first gate voltage at the first gate terminal 312 to be responsive to a first drain voltage at a first drain terminal of the first transistor 304 and may cause a second gate voltage at the second gate terminal 314 to be responsive to a second drain voltage at a second drain terminal of the second transistor 306. As another example, deactivating the transistor (MPSW) 420 may cause a first gate voltage (Vcpgate) at the first gate terminal 436 to be responsive to a first drain voltage (Voutp) at a first drain terminal of the first transistor (M1pc) 422 and may cause a second gate voltage (Vcngate) at the second gate terminal 438 to be responsive to a second drain voltage (Voutn) at a second drain terminal of the second transistor (M1nc) 424.

The method 700 enables gain control of an amplifier stage while reducing voltage "stress" on one or more transistors. For example, the gain of the amplifier stage may be adjusted by turning on or off one or more unit cells of the amplifier stage. By using the transistor and the high impedance elements to isolate, or substantially isolate, the first gate terminal from the second gate terminal when the differential cascode amplifier is turned off, the method 700 enables a reduction in drain-to gate voltages of the transistors as compared to transistors having the gate terminals "forced" to a logical low voltage level (e.g., approximately zero volts) when the differential cascode amplifier is turned off. Reducing the drain-to-gate voltages reduces a possibility of damage to the transistors and increases reliability of the differential cascode amplifier. Additionally, enabling gate voltages to track the respective drain voltages increases a linearity of the differential cascode amplifier (e.g., a linearity of a relationship between an amplified differential output and a received differential input).

In conjunction with the described embodiments, an apparatus includes means for amplifying a differential signal. The means for amplifying may include or correspond to the differential cascode amplifier 302 of FIG. 3, the differential cascode amplifier 412 of FIG. 4, one or more other devices, circuits, modules, or instructions to amplify a differential signal, or any combination thereof. The means for amplifying may include a first transistor having a first gate terminal and a second transistor having a second gate terminal. The first transistor may include or correspond to the first transistor 304 having the first gate terminal 312 of FIG. 3 or the first transistor (M1pc) 422 having the first gate terminal 436 of FIG. 4, and the second transistor may include or correspond to the second transistor 306 having the second gate terminal 314 of FIG. 3 or the second transistor (M1nc) 424 having the second gate terminal 438 of FIG. 4.

The apparatus may include means for selectively coupling the first gate terminal to the second gate terminal. The means for selectively coupling may include or correspond to the transistor 320 of FIG. 3, the transistor (MPSW) 420 of FIG. 4, one or more other devices, circuits, modules, or instructions to selectively couple the first gate terminal to the second gate terminal, or any combination thereof.

In an exemplary embodiment, the apparatus may further include a first high impedance element coupled to the first gate terminal and to a control node and a second high impedance element coupled to the second gate terminal and to the control node. The first high impedance element and the second high impedance element may include or correspond to the first high impedance element 322 and the second high impedance element 324 of FIG. 3 or the first resistor 414 and the second resistor 416 of FIG. 4, respectively. The control node may include or correspond to the control node 326 of FIG. 3 or the control node 434 of FIG. 4.

In an exemplary embodiment, the first high impedance element and the second high impedance element may include resistors, inductors, or a combination thereof. The means for selectively coupling may be activated during a first mode of operation of the means for amplifying to couple the first gate terminal to the second gate terminal, and may be deactivated during a second mode of operation of the means for amplifying to increase an impedance from the first gate terminal to the second gate terminal via the first high impedance element and the second high impedance element. For example, the means for selectively coupling may isolate, or substantially isolate, the first gate terminal from the second gate terminal to enable gate voltages to be responsive to (e.g., to "track") drain voltages, as described with reference to FIGS. 3-4 and 7.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. For example, the control signals 296pa of FIG. 2, the enable signal 330 of FIG. 3, the enable signal (Turn_ON) 440 of FIG. 4, or a combination thereof, may be generated by a processor that executes instructions. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. To illustrate, a processor may execute instructions to perform a method or algorithm that includes generating the enable signal 330 of FIG. 3 or the enable signal (Turn_ON) 440 of FIG. 4. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. For example, although certain exemplary circuits have been described, other circuits can be implemented. Thus, the present disclosure is not intended to be limited to the embodiments shown herein but is to be accorded the widest scope possible consistent with the principles and novel features as defined by the following claims.

What is claimed is:

1. An apparatus comprising:
a differential cascode amplifier comprising a first cascode transistor and a second cascode transistor;
a transistor including:
  a source terminal coupled to a gate terminal of the first cascode transistor of the differential cascode amplifier;
  a drain terminal coupled to a gate terminal of the second cascode transistor of the differential cascode amplifier; and
  a terminal configured to receive an enable signal, the transistor configured to selectively couple the gate terminal of the first cascode transistor to the gate terminal of the second cascode transistor based on the enable signal having a first value, the transistor further configured to substantially isolate the gate terminal of the first cascode transistor from the gate terminal of the second cascode transistor responsive to the enable signal having a second value;

a first high impedance element coupled to the source terminal of the transistor, wherein the first high impedance element comprises a first resistor or a first inductor; and
a second high impedance element coupled to the first high impedance element and to the drain terminal, wherein the second high impedance element comprises a second resistor or a second inductor.

2. The apparatus of claim 1, wherein the differential cascode amplifier further comprises:
a third transistor coupled to the first cascode transistor and having a gate terminal configured to receive a first differential signal; and
a fourth transistor coupled to the second cascode transistor and having a gate terminal configured to receive a second differential input signal, wherein the first cascode transistor and the third transistor form a first cascode transistor pair, and wherein the second cascode transistor and the fourth transistor form a second cascode transistor pair.

3. The apparatus of claim 1, further comprising:
an antenna; and
a transformer coupled to the differential cascode amplifier, wherein the transformer is configured to provide an output of the differential cascode amplifier to the antenna.

4. The apparatus of claim 1, further comprising a power amplifier, wherein the transistor and the differential cascode amplifier are included in the power amplifier.

5. The apparatus of claim 1, further comprising a driver amplifier, wherein the transistor and the differential cascode amplifier are included in the driver amplifier.

6. An apparatus comprising:
means for amplifying a differential signal, the means for amplifying including a first cascode transistor having a first gate terminal and a second cascode transistor having a second gate terminal;
means for selectively coupling the first gate terminal to the second gate terminal responsive to an enable signal having a first value and for substantially isolating the first gate terminal from the second gate terminal responsive to the enable signal having a second value; and
first means for providing an inductive impedance coupled to the first gate terminal.

7. The apparatus of claim 6, wherein the means for selectively coupling the first gate terminal to the second gate terminal includes a transistor.

8. The apparatus of claim 6, wherein the means for amplifying the differential signal further comprises:
a third transistor coupled to the first cascode transistor, wherein a gate of the third transistor is configured to receive a first differential input signal; and
a fourth transistor coupled to the second cascode transistor, wherein a gate of the fourth transistor is configured to receive a second differential input signal, wherein the first cascode transistor and the third transistor form a first cascode transistor pair, and wherein the second cascode transistor and the fourth transistor form a second cascode transistor pair.

9. An apparatus comprising:
means for amplifying a differential signal, the means for amplifying including a first cascode transistor having a first gate terminal and a second cascode transistor having a second gate terminal;
means for selectively coupling the first gate terminal to the second gate terminal;

first means for inductively coupling the first gate terminal to a bias voltage; and a power amplifier or a driver amplifier, wherein the means for amplifying the differential signal, the means for selectively coupling the first gate terminal to the second gate terminal, and the means for inductively coupling are included in the power amplifier or the driver amplifier.

10. The apparatus of claim 6, further comprising a driver amplifier, wherein the means for amplifying the differential signal and the means for selectively coupling the first gate terminal to the second gate terminal are included in the driver amplifier.

11. The apparatus of claim 6, further comprising means for providing an output of the means for amplifying the differential signal to an antenna, wherein the means for amplifying the differential signal includes a differential cascode amplifier.

12. A method comprising:
amplifying a differential signal at a differential cascode amplifier including a first cascode transistor having a first gate terminal and further including a second cascode transistor having a second gate terminal, wherein the first gate terminal is coupled to a first high impedance element that comprises a resistor or an inductor;
during a first mode, activating a transistor coupled between the first gate terminal and the second gate terminal to couple the first gate terminal to the second gate terminal via the transistor; and
during a second mode, deactivating the transistor to increase an impedance from the first gate terminal to the second gate terminal based at least in part on the first high impedance element.

13. The method of claim 12, wherein, during the second mode, a voltage at the first gate terminal tracks a drain voltage of the first cascode transistor and a voltage at the second gate terminal tracks a drain voltage of the second cascode transistor.

14. An apparatus comprising:
a differential cascode amplifier comprising a first transistor and a second transistor;
a transistor including:
a source terminal coupled to a gate terminal of the first transistor of the differential cascode amplifier, wherein the source terminal is coupled to a first inductor;
a drain terminal coupled to a gate terminal of the second transistor of the differential cascode amplifier, wherein the drain terminal is coupled to a second inductor; and
a terminal configured to receive an enable signal, the transistor configured to selectively couple the gate terminal of the first transistor to the gate terminal of the second transistor based on the enable signal having a first value, the transistor further configured to substantially isolate the gate terminal of the first transistor from the gate terminal of the second transistor responsive to the enable signal having a second value;
a third transistor coupled to the first transistor, wherein a gate of the third transistor is configured to receive a first differential input signal; and
a fourth transistor coupled to the second transistor, wherein a gate of the fourth transistor is configured to receive a second differential input signal.

15. The apparatus of claim 14, wherein the first inductor is coupled to the gate terminal of the first transistor, wherein the second inductor is coupled to the gate terminal of the second transistor, and wherein the first inductor and the second inductor are configured to receive a bias voltage.

16. The apparatus of claim 1, wherein the first high impedance element is coupled between the source terminal of the transistor and a control node, the control node configured to receive a bias voltage.

17. The apparatus of claim 1, further comprising a plurality of unit cells of an amplifier, wherein a first unit cell of the plurality of unit cells includes the differential cascode amplifier, the transistor, and the first high impedance element.

18. The apparatus of claim 17, wherein an output of the differential cascode amplifier is coupled to an output of a second differential cascode amplifier of a second unit cell of the plurality of unit cells.

19. The apparatus of claim 18, further comprising a transformer, wherein the output of each unit cell of the plurality of unit cells is coupled to the transformer.

20. The apparatus of claim 17, wherein each unit cell of the plurality of unit cells is selectively activatable based on a corresponding enable signal.

* * * * *